United States Patent
Fujimoto et al.

(10) Patent No.: US 10,147,859 B2
(45) Date of Patent: Dec. 4, 2018

(54) THERMOELECTRIC POWER MODULE

(71) Applicant: KELK LTD., Kanagawa (JP)

(72) Inventors: Shinichi Fujimoto, Kanagawa (JP);
Hiroyuki Matsunami, Kanagawa (JP)

(73) Assignee: KELK LTD., Kanagawa (JP)

(*) Notice: Subject to any disclaimer, the term of this patent is extended or adjusted under 35 U.S.C. 154(b) by 0 days.

(21) Appl. No.: 14/909,158

(22) PCT Filed: Aug. 25, 2014

(86) PCT No.: PCT/JP2014/072846
§ 371 (c)(1),
(2) Date: Feb. 1, 2016

(87) PCT Pub. No.: WO2015/030218
PCT Pub. Date: Mar. 5, 2015

(65) Prior Publication Data
US 2016/0172569 A1     Jun. 16, 2016

(30) Foreign Application Priority Data
Aug. 30, 2013 (JP) .................. 2013-180060

(51) Int. Cl.
*H01L 35/16* (2006.01)
*H01L 35/08* (2006.01)

(52) U.S. Cl.
CPC .............. *H01L 35/16* (2013.01); *H01L 35/08* (2013.01)

(58) Field of Classification Search
CPC ................................. H01L 35/16; H01L 35/08
See application file for complete search history.

(56) References Cited

U.S. PATENT DOCUMENTS 3,210,216 A * 10/1965 Feduska .............. B23K 35/3013
136/237
6,083,770 A * 7/2000 Sato .................... H01L 35/16
257/467

(Continued)

FOREIGN PATENT DOCUMENTS

JP        9-293906     11/1997
JP        11-186616    7/1999

(Continued)

OTHER PUBLICATIONS

Sato, "Co—Mo thin films with an artificially layered structure", Apr. 1988.*

(Continued)

*Primary Examiner* — Uyen M Tran
(74) *Attorney, Agent, or Firm* — Wenderoth, Lind & Ponack, L.L.P.

(57) ABSTRACT

A thermoelectric power module capable of suppressing diffusion of not only a material of a solder layer but also a material of a solder joint layer into a thermoelectric element, or suppressing oxidation of the thermoelectric element. The thermoelectric power module includes in sequence: a thermoelectric element consisting essentially of a thermoelectric material containing at least two kinds of elements of bismuth (Bi), tellurium (Te), antimony (Sb), and selenium (Se) as principal components; a first diffusion prevention layer consisting essentially of at least one of molybdenum (Mo) and tungsten (W); a second diffusion prevention layer consisting essentially of at least one of cobalt (Co), titanium (Ti), and an alloy or compound containing them as principal components; and a solder joint layer consisting essentially of at least one of nickel (Ni), tin (Sn), and an alloy or compound containing them as principal components.

4 Claims, 14 Drawing Sheets

(56) References Cited

U.S. PATENT DOCUMENTS

2011/0083743 A1* 4/2011 Yamamoto .......... H01L 31/0322
136/262
2013/0032188 A1* 2/2013 Kajihara ................ H01L 35/08
136/200

FOREIGN PATENT DOCUMENTS

| JP | 2001-28462 | 1/2001 | |
|---|---|---|---|
| JP | 2002-246659 | 8/2002 | |
| JP | 2003-282962 | 10/2003 | |
| JP | 2006-147600 | 6/2006 | |
| JP | 2008-10612 | 1/2008 | |
| JP | 2010-182940 | 8/2010 | |
| JP | 2011-171668 | 9/2011 | |
| WO | WO 2011102498 | * | 8/2011 |

OTHER PUBLICATIONS

International Search Report dated Dec. 2, 2014 in corresponding International (PCT) Application No. PCT/JP2014/072846.
Notification of Reasons for Rejection dated Oct. 4, 2016, in counterpart Japanese Application No. 2013-180060, with English translation.

* cited by examiner

- ELECTRODE
- SOLDER LAYER
- THERMOELECTRIC ELEMENT

- SOLDER LAYER
- Mo
- THERMOELECTRIC ELEMENT

- ELECTRODE
- SOLDER LAYER
- THERMOELECTRIC ELEMENT

- ELECTRODE
- SOLDER LAYER
- THERMOELECTRIC ELEMENT

- ELECTRODE
- SOLDER LAYER
- THERMOELECTRIC ELEMENT

- ELECTRODE
- SOLDER LAYER
- THERMOELECTRIC ELEMENT (A)  (B)

THERMOELECTRIC POWER MODULE

TECHNICAL FIELD

The present invention relates to a thermoelectric power module using thermoelectric elements and thereby generating electricity by utilizing difference in temperature.

BACKGROUND ART

Conventionally, thermoelectric generation of electricity is known in which the thermoelectric elements are disposed between a heat exchanger at a higher temperature part and another heat exchanger at a lower temperature part to generate electricity. The thermoelectric element is an application of a thermoelectric effect to be called Seebeck effect. In the case where a semiconductor material is used as a thermoelectric material, the thermoelectric power module is configured by electrically connecting a thermoelectric element (P-type element) formed of a P-type semiconductor thermoelectric material and another thermoelectric element (N-type element) formed of an N-type semiconductor thermoelectric material via an electrode.

Such a thermoelectric power module has a simple structure and can be easily treated, and stable characteristics can be retained. Therefore, research work thereof has been widely progressed toward application for the thermoelectric generation of electricity in which electricity is generated by utilizing heat in a gas discharged from an engine of a car, a furnace of a factory, and so on.

Generally, the thermoelectric power module is used in a temperature environment where a difference between a temperature (Th) at a higher temperature part and a temperature (Tc) at a lower temperature part becomes large in order to obtain high thermoelectric conversion efficiency. For example, a thermoelectric power module employing a typical bismuth-tellurium (Bi—Te) based thermoelectric material is used in a temperature environment where a temperature (Th) at the higher temperature part becomes 250° C. to 280° C. at maximum. Accordingly, diffusion of a material of a joint layer for joining the thermoelectric element to the electrode into the thermoelectric element or oxidation of the thermoelectric element becomes a problem.

As a related art, Japanese patent application publication JP-P2001-28462A (paragraphs 0001-0007) discloses a thermoelectric element which has a barrier film for preventing diffusion of an electrode material from the electrode, and conveyance of which at a conveyance process or the like in a manufacturing process is easy. JP-P2001-28462A is aimed to solve the problem that, in the case where the barrier film for preventing diffusion of an electrode material (Cu) from the electrode into the thermoelectric element is formed of Ni or a Ni-base alloy, the barrier film is magnetized to adhere to an apparatus or the barrier film adheres to the magnetized apparatus on the contrary at an assembly process, and thereby the manufacturing process is delayed.

It is described that the barrier film preferably consists of at least one kind of metal or alloy selected from a group consisting of Ag, Al, Cr, Mo, Pt, Pd, Ti, Ta, W, Zr, V, Nb, and In. However, in the case where a solder joint layer for improving joint with solder is provided between the solder and the barrier layer in order to join the thermoelectric element to the electrode, diffusion of a constituent element of the solder joint layer cannot be effectively prevented.

Further, in the case of a thermoelectric power module which is used in a temperature range not lower than 250° C. for example, the material itself of the barrier film diffuses into the thermoelectric element, and therefore, Ag, Cr, Pt, Pd, and In, a film of which can be formed by a plating method, cannot be used for a long time. On the other hand, as to Al, Mo, Ti, Ta, W, Zr, V, and Nb, a film of which cannot be formed by the plating method, a film thereof is generally formed by a PVD method such as a vapor deposition method. However, JP-P2001-28462A describes that a total thickness of a film formed by vapor deposition is 100 nm to 1000 nm, and if a film thickness exceeds 1000 nm, the film becomes apt to peel off a substrate due to stress in the film and cannot be used positively (paragraph 0027).

However, according to a result of investigation conducted by the inventors of the present application by using a molybdenum (Mo) film, no sufficient effect of preventing diffusion and oxidation can be obtained in the case where the film thickness is 1.34 µm or less. FIG. 25 shows difference of effects of preventing diffusion and oxidation according to a thickness of a molybdenum film formed on a surface of an N-type element. The thickness of the molybdenum (Mo) film in each sample was measured at three locations of each sample within one lot. FIG. 25 shows a result of an endurance test performed for three kinds of samples in the air at a temperature of 350° C. for 500 hours.

FIG. 25(A) shows a photomicrograph of a cross section of a sample in which a molybdenum film has a thickness of 0.25 µm to 0.36 µm, and FIG. 25(B) shows a photomicrograph of a cross section of a sample in which a molybdenum film has a thickness of 0.70 µm to 1.34 µm. It is understood that oxidation has progressed within the N-type element in both samples. On the other hand, FIG. 25(C) shows a photomicrograph of a cross section of a sample in which a molybdenum film has a thickness of 4.08 µm to 5.34 µm. It is understood that oxidation within the N-type element is suppressed in this sample. Further, according to a film forming technique used by the inventors of the present application, even in the case where the film thickness is 3 µm or larger, peeling off of the molybdenum film does not occur for a long time.

Japanese patent application publication JP-A-H9-293906 (paragraphs 0004-0006) discloses that Cu of an electrode diffuses into a semiconductor via solder at a high temperature in the case where the solder at a high temperature is used, and discloses a thermoelectric element aimed to prevent a decline of a thermoelectric conversion efficiency of the semiconductor itself due to the diffusion. The thermoelectric element is characterized in that an interposing layer in contact with a Bi—Te based semiconductor having a conducting type of P-type or N-type is connected to the electrode, and the interposing layer is one of a group consisting of Al, Ti, and Mg, or an alloy thereof.

However, as a result of investigation conducted by the inventors of the present application, a film of Al or Ti cannot be formed by the plating method, and therefore, the film is generally formed by using a sputtering method or a vapor deposition method as a thin film technology, or a screen printing method as a thick film technology. In the case where the film thickness is set to several micrometers or larger in a conventional thin film technology, peeling off occurs due to difference between linear expansion coefficients of the film and the thermoelectric material, and therefore, it is difficult to repetitively change a temperature for a long time. On the other hand, a film formed by a thick film technology lacks elaborateness, and therefore, there is a problem that a semiconductor directly under the film is oxidized due to transit of oxygen at a high temperature of, for example, 250° C. or higher, and the electric resistance increases.

Further, according to a result of investigation conducted by the inventors of the present application, when a thermoelectric element formed with sputtered films of titanium (Ti) and nickel (Ni) is heated to a temperature of 350° C., mutual diffusion of materials occurs between the nickel film and the thermoelectric element, and nickel is oxidized in the thermoelectric element directly under the titanium film, and thus, the above-mentioned purpose cannot be achieved.

FIG. 26 shows a change in an endurance test in the case where sputtered films of titanium and nickel are formed in sequence on a surface of a P-type element. FIG. 26(A) shows a photomicrograph of a cross section of a sample in which a titanium (Ti) film having a thickness of 0.5 μm and a nickel (Ni) film having a thickness of 0.5 μm are formed in sequence on the surface of the P-type element. Further, FIG. 26(B) shows a photomicrograph of the cross section of the sample after the endurance test is performed in the air at a temperature of 350° C. for 500 hours. It is understood that materials (Ni, Te, and so on) have mutually diffused between the nickel film and the P-type element, and oxidation has occurred in a portion of the P-type element.

FIG. 27 shows a change in an endurance test in the case where sputtered films of titanium and nickel are formed in sequence on a surface of an N-type element. FIG. 27(A) shows a photomicrograph of a cross section of a sample in which a titanium (Ti) film having a thickness of 0.5 μm and a nickel (Ni) film having a thickness of 0.5 μm are formed in sequence on the surface of the N-type element. Further, FIG. 27(B) shows a photomicrograph of the cross section of the sample after the endurance test is performed in the air at a temperature of 350° C. for 500 hours. It is understood that materials (Ni, Te, and so on) have mutually diffused between the nickel film and the N-type element, and oxidation has occurred in a wide range of the N-type element.

Japanese patent application publication JP-P2006-147600A (paragraphs 0023-0024) discloses obtaining a thermoelectric module which has high efficiency especially at a middle or high temperature such as 400° C. or higher, and in which aged deterioration and performance decrement very hardly occur. The thermoelectric module consists of a thermoelectric conversion part, a heat absorption part, and a heat radiation part, and is characterized in that the thermoelectric conversion part and the heat absorption part are firmly fixed to each other via a stress relaxation layer into one body.

In the thermoelectric module disclosed in JP-P2006-147600A, a metal foil (Cu, Fe, Ni, Ag, Ti, Zr, Al, Nb, Mo, or the like) occluding hydrogen is sandwiched between a thermoelectric element and an electrode in order to join the thermoelectric element to the electrode without using any inclusion such as a special jointing material or a sprayed layer, or flux (See paragraph 0044).

However, in the case where the thermoelectric module is used at a high temperature of, for example, 250° C. or higher, there is a problem that Cu, Fe, Ni, and Ag easily diffuse into the thermoelectric element to deteriorate the thermoelectric conversion characteristics. On the other hand, Ti, Zr, Al, Nb, and Mo hardly diffuse into the thermoelectric element, but have linear expansion coefficients greatly different from that of a thermoelectric material. Accordingly, in the case where the electrode and the thermoelectric element are joined to each other without using solder, there is a high possibility of damage if a temperature is repetitively changed for a long time. Further, the metal foil occluding hydrogen is undesirable in view of safety and cost.

Japanese patent application publication JP-A-H11-186616 (paragraphs 0004 and 0015) discloses a thermoelectric element in which an alloy layer is formed on a thermoelectric semiconductor in order not to degrade the performance, and thereby deterioration of the thermoelectric element can be prevented when an electrode is joined thereto and when an electric current flows after the electrode is joined. The thermoelectric element consists of (a) a thermoelectric semiconductor of a Bi—Te—Se base alloy (n-type) or a thermoelectric semiconductor of a Bi—Sb—Te base alloy (p-type), (b) an alloy layer of at least one kind of element of trivalent or tetravalent elements (B, Ga, In, Tl, C, Si, Ge, and Sn) and at least one kind of metal of Si, Sb, Te, and Se, or a Bi—Te—Se base alloy, or a Bi—Sb—Te base alloy, (c) a layer consisting of at least one kind of element of the trivalent or tetravalent elements (B, Ga, In, Tl, C, Si, Ge, and Sn), (d) a layer consisting of at least one kind of element of metals (Ti, Cr, Co, Ni, Nb, Mo, and W) having a diffusion preventing effect, and (e) electrode materials (a solder material and an electrode).

JP-A-H11-186616 is aimed to prevent diffusion of a material of the electrode into the thermoelectric semiconductor. However, since the diffusion prevention layer is disposed on the layer of the trivalent or tetravalent element (See FIG. 4 of JP-A-H11-186616), it is impossible to sufficiently prevent diffusion of the trivalent or tetravalent element into the thermoelectric semiconductor. Especially, Ga, In, Ge, and Sn are easily dissolved into the thermoelectric material and function as an acceptor, and therefore, it is difficult to maintain the alloy layer of at least one kind of element thereof and the at least one kind of metal of Bi, Sb, Te, and Se, or the Bi—Te—Se base alloy, or the Bi—Sb—Te base alloy to be stable even at a high temperature. Thus, there is a problem that thermoelectric conversion characteristics of the thermoelectric material are easily deteriorated.

Further, as the metals having a diffusion preventing effect, Ti, Cr, Co, Ni, Nb, Mo, and W are exemplified. However, as to Ti, Nb, Mo, and W, a film thereof cannot be formed by a plating method, and therefore, the above-mentioned problem occurs unless special contrivance is made, and it is difficult to obtain a sufficient diffusion preventing effect at a high temperature of, for example, 250° C. or higher. Furthermore, Co, Ni, Cr, and so on are apt to diffuse into the thermoelectric material, and form an alloy or intermetallic compound with Te in some cases to deteriorate thermoelectric conversion characteristics, and therefore, they are not much suitable.

Japanese patent application publication JP-P2008-10612A (paragraphs 0010-0012) discloses a method of manufacturing a thermoelectric element, which method is capable of forming a diffusion prevention layer effective for preventing diffusion of elements and having a high peel strength, on a thermoelectric material containing at least one of bismuth, tellurium, selenium, and antimony, and discloses a thermoelectric element manufactured by using such a method of manufacturing a thermoelectric element. The thermoelectric element includes a thermoelectric material containing at least two of bismuth (Bi), tellurium (Te), selenium (Se), and antimony (Sb), a diffusion prevention layer formed on the thermoelectric material and for preventing diffusion of a different kind of element into the thermoelectric material, and a solder joint layer formed on the diffusion prevention layer and for joining the diffusion prevention layer and solder to each other, and is characterized in that a peel strength at an interface between the thermoelectric material layer and the diffusion prevention layer or an interface between the diffusion prevention layer and the solder joint layer is 0.6 MPa or more.

The thermoelectric element disclosed in JP-P2008-10612A has a structure of an electrode/a solder layer/a solder joint layer/a diffusion prevention layer/a thermoelectric material layer, and thereby, greatly improves the problem in JP-P2001-28462A, JP-A-H9-293906, JP-P2006-147600A, and JP-A-H11-186616. However, it is insufficient in view of preventing mutual diffusion between the solder layer or the older joint layer and the thermoelectric material layer, or preventing oxidation of the thermoelectric material layer.

FIG. 28 shows a result of an endurance test in the case where a molybdenum film, a nickel film, and a tin film are formed in sequence on a surface of a thermoelectric material layer. In this thermoelectric power module, a molybdenum (Mo) film having a thickness of 5 µm, a nickel (Ni) film having a thickness of 1 µm, and a tin (Sn) film having a thickness of 0.2 µm are formed in sequence on the surface of the thermoelectric material layer. The tin (Sn) film is joined to an electrode via a solder layer. FIG. 28 shows a photomicrograph of a cross section of a thermoelectric power module after an endurance test is performed in the air at a temperature of 280° C. for 5000 hours. It is understood that nickel (Ni) has diffused into the thermoelectric material layer and oxidation occurs in a portion of the thermoelectric material layer, and also the thermoelectric material (Te) has diffused into the solder layer.

SUMMARY OF INVENTION

Technical Problem

Accordingly, in view of the above-mentioned points, an object of the present invention is to provide a thermoelectric power module capable of suppressing diffusion of not only a material of a solder layer but also a material of a solder joint layer into a thermoelectric element, or suppressing oxidation of the thermoelectric element.

Solution to Problem

In order to achieve the above-mentioned object, a thermoelectric power module according to one aspect of the present invention includes in sequence: a thermoelectric element consisting of a thermoelectric material containing at least two kinds of elements of bismuth (Bi), tellurium (Te), antimony (Sb), and selenium (Se) as principal components; a first diffusion prevention layer consisting of at least one of molybdenum (Mo) and tungsten (W); a second diffusion prevention layer consisting of at least one of cobalt (Co), titanium (Ti), and an alloy or compound containing cobalt (Co) and titanium (Ti) as principal components; and a solder joint layer consisting of at least one of nickel (Ni), tin (Sn), and an alloy or compound containing nickel (Ni) and tin (Sn) as principal components.

Advantageous Effects of Invention

According to one aspect of the present invention, by providing the first diffusion prevention layer consisting essentially of at least one of molybdenum (Mo) and tungsten (W), and the second diffusion prevention layer consisting essentially of at least one of cobalt (Co), titanium (Ti), and the alloy or compound containing them as principal components in sequence on a surface of the thermoelectric element, it is possible to suppress diffusion of not only a material of a solder layer but also a material of the solder joint layer into the thermoelectric element, or suppress oxidation of the thermoelectric element.

DESCRIPTION OF EMBODIMENTS

Figure 1:
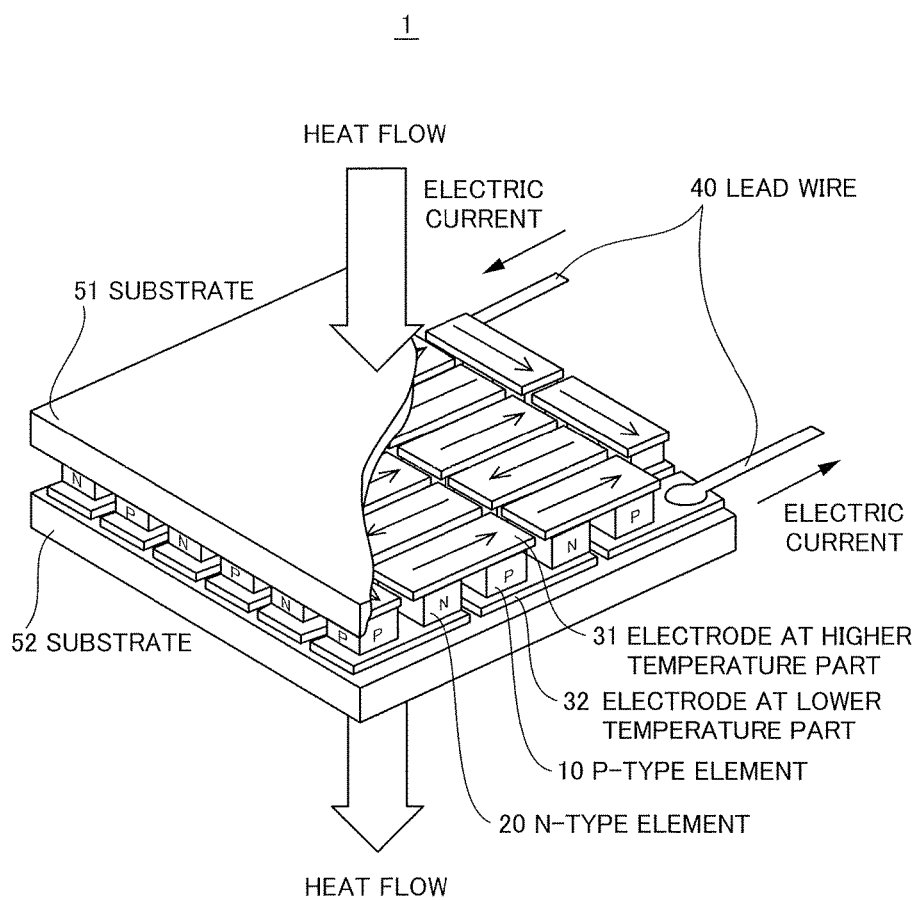
FIG. 1 is a perspective diagram showing an outline of a thermoelectric power module according to an embodiment of the present invention.

Hereinafter, an embodiment of the present invention will be explained in detail by referring to the drawings. The same reference characters are assigned to the same component elements, and overlapping description thereof will be omitted.

FIG. 1 is a perspective diagram showing an outline of a thermoelectric power module according to an embodiment of the present invention. In the thermoelectric power module 1, a thermoelectric element (P-type element) 10 formed of a P-type semiconductor thermoelectric material and a thermoelectric element (N-type element) 20 formed of an N-type semiconductor thermoelectric material are electrically connected via an electrode 31 or 32, and thereby, a PN element pair is configured. Further, plural PN element pairs are connected in series via plural electrodes 31 at a higher temperature part and plural electrodes 32 at a lower temperature part.

Two lead wires 40 are electrically connected via two electrodes 32 at the lower temperature part to the P-type element at one end and the N-type element at the other end of a series circuit composed of the plural PN element pairs, respectively. In FIG. 1, substrates (heat exchange substrates) 51 and 52 formed of an electric insulation material such as ceramics are arranged to hold those PN element pairs therebetween. When supplying heat to the substrate 51 part and cooling the substrate 52 part by coolant or the like, electromotive force is generated in the thermoelectric power module 1. When a load (not shown) is connected between the two lead wires 40, an electric current flows as shown in FIG. 1. That is, by supplying difference in temperature between both parts of the thermoelectric power module 1 (an upper part and a lower part in the drawing), electric power can be extracted.

Here, it is desirable that either one or both of the substrates 51 and 52 are omitted such that either one or both of the electrode 31 at the higher temperature part and the electrode 32 at the lower temperature part may be in directly contact with a surface of heat exchanger having an electrical insulating property. In that case, the thermoelectric conversion efficiency can be improved. The thermoelectric power module, in which either one of the substrates 51 and 52 is omitted, is called half-skeleton structure, and the thermoelectric power module, in which both of the substrates 51 and 52 are omitted, is called full-skeleton structure.

Each of the P-type element 10 and the N-type element 20 is composed of a bismuth-tellurium (Bi—Te) based thermoelectric material containing at least two kinds of elements of bismuth (Bi), tellurium (Te), antimony (Sb), and selenium (Se) as principal components. For example, the P-type element 10 is composed of a thermoelectric material containing bismuth (Bi), tellurium (Te), and antimony (Sb). Further, the N-type element 20 is composed of a thermoelectric material containing bismuth (Bi), tellurium (Te), and selenium (Se). Especially, in a temperature environment where a temperature of a heat exchanger at a higher temperature part becomes 250° C. to 280° C. at maximum, the bismuth-tellurium (Bi—Te) based thermoelectric material is suitable. Further, the electrode 31 at the higher temperature side and the electrode 32 at the lower temperature side are composed of, for example, copper (Cu) having a high electrical conduction property and high thermal conductivity.

Figure 2:
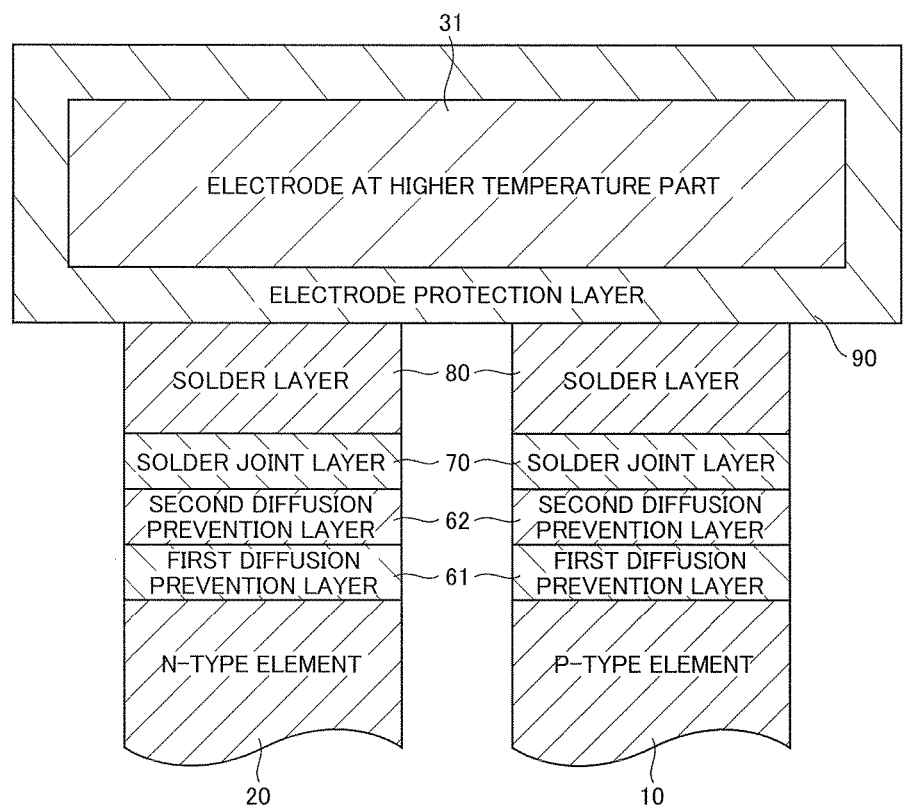
FIG. 2 is a cross section diagram showing a part of a thermoelectric power module according to an embodiment of the present invention.

FIG. 2 is a cross section diagram showing a part of a thermoelectric power module according to an embodiment of the present invention. Although FIG. 2 shows structure of a joint part of the P-type element 10 and the electrode 31 at the higher temperature part and a joint part of the N-type element 20 and the electrode 31 for example, structure of a joint part of the P-type element 10 and the electrode 32 (FIG. 1) at the lower temperature part and a joint part of the N-type element 20 and the electrode 32 may be the same as the structure as shown in FIG. 2. However, a size of each part may be changed suitably.

As shown in FIG. 2, the thermoelectric power module includes a P-type element 10, an N-type element 20, a first diffusion prevention layer 61, a second diffusion prevention layer 62, a solder joint layer 70, and a solder layer 80 joined to the solder joint layer 70. The first diffusion prevention layer 61, the second diffusion prevention layer 62, and the solder joint layer 70 are disposed in sequence on a surface (top surface in the drawing) of each of the P-type element 10 and the N-type element 20.

Further, the thermoelectric power module includes an electrode 31 at a higher temperature part, and an electrode protection layer 90 disposed at least on one principal surface (bottom surface in the drawing) of the electrode 31 at the higher temperature part. The electrode protection layer 90 is formed on the electrode 31 at the higher temperature part by plating or the like, and may be formed on not only the one principal surface but also all side surfaces and the other principal surface (top surface in the drawing) of the electrode 31 at the higher temperature part as shown in FIG. 2. The solder layer 80 joins the solder joint layer 70 to a partial area of the electrode protection layer 90.

The electrode protection layer 90 is provided mainly for a purpose of preventing oxidation or improving solder wettability of the electrode 31 at the higher temperature part. For example, the electrode protection layer 90 includes at least one of nickel (Ni), layered structure of gold/nickel (Au/Ni), tin (Sn), an alloy or intermetallic compound or the like containing nickel (Ni), and combined structure of at least two thereof. A thickness of the electrode protection layer 90 is substantially 20 μm, and a thickness of the solder layer 80 is substantially 50 μm to substantially 150 μm, for example.

The first diffusion prevention layer 61 consists of at least one of molybdenum (Mo) and tungsten (W). The second diffusion prevention layer 62 consists of at least one of cobalt (Co), titanium (Ti), and an alloy or compound containing them as principal components. Here, the compound is a conception including an intermetallic compound, a nitride, or the like.

Further, the solder joint layer 70 consists of at least one of nickel (Ni), tin (Sn), and an alloy or compound containing them as principal components such as nickel-tin (Ni—Sn). By providing the solder joint layer 70, the solder wettability can be improved. In the present embodiment, an alloy film of nickel-tin having a thickness of 0.9 μm is provided as the solder joint layer 70. When the thermoelectric power module is used at a high temperature, most part of the alloy of nickel-tin changes into an intermetallic compound of nickel-tin.

Especially, in the case where the solder joint layer 70 is composed of the alloy or intermetallic compound of nickel-tin rather than nickel, even if the thermoelectric power module is left in a high temperature environment for a long time, diffusion of nickel from the solder joint layer 70 into the solder layer 80 is suppressed. This is because energy is required when the intermetallic compound of nickel-tin forming the solder joint layer 70 is decomposed into nickel and tin, and more energy is required for nickel composing the intermetallic compound to diffuse into solder than that required for nickel simple substance to diffuse into solder.

As a diffusion prevention layer disposed between the thermoelectric element and the solder joint layer 70, even only the first diffusion prevention layer 61 can suppress diffusion of a material of the solder layer 80 into the thermoelectric element. However, it is insufficient for suppressing mutual diffusion between a material of the solder joint layer 70 and the thermoelectric material, or suppressing oxidation of the thermoelectric element. Accordingly, by providing the second diffusion prevention layer 62, it becomes possible to more effectively suppress the mutual diffusion between the material of the solder joint layer 70 and the thermoelectric material, or suppress oxidation of the thermoelectric element. As a result, a thermoelectric power module can be provided which is capable of bearing a long time use under a high temperature environment where a temperature of a higher temperature part becomes 250° C. to 280° C. at maximum.

It is desirable that the first diffusion prevention layer 61 has constitution of columnar structure (See FIG. 23) having a longitudinal direction substantially orthogonal to a principal surface (bottom surface in the drawing) of the film. In that case, it is possible to mitigate film stress generated due to a difference between linear expansion coefficients of adjacent two layers. Further, it is desirable that the first diffusion prevention layer 61 has preferably a thickness of 2.7 μm or larger, more preferably a thickness of 4 μm or larger. In the case where the first diffusion prevention layer 61 has a thickness of 2.7 μm or larger, oxidation of the thermoelectric element can be more effectively suppressed. Further, if the constitution of the first diffusion prevention layer 61 is columnar structure, even in the case where the first diffusion prevention layer 61 has a thickness of 2.7 μm or larger, it is possible to mitigate film stress generated due to a difference between linear expansion coefficients of adjacent two layers, and thereby prevent peeling off of the film.

Figure 3:
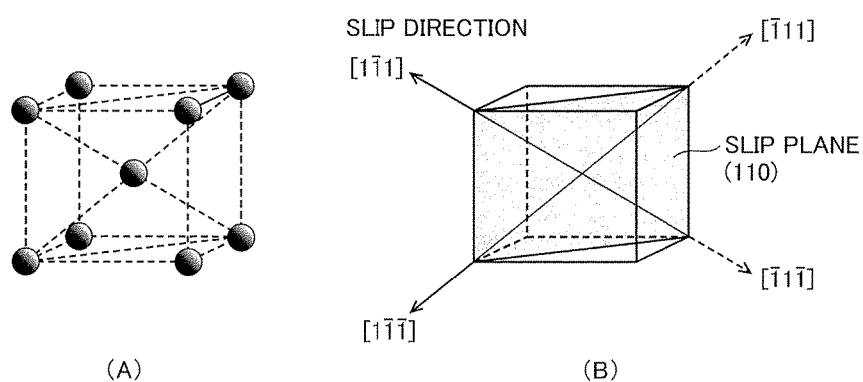
FIG. 3 shows a body-centered cubic lattice and slip systems thereof.

For example, in the case where molybdenum (Mo) having crystal structure of a body-centered cubic lattice as shown in FIG. 3(A) is employed as a material of the first diffusion prevention layer 61, since a slip plane of the body-centered cubic lattice is {110} plane, it is ideally desirable that {110} plane is orientated substantially orthogonal to a principal surface of the film. Here, {110} plane is a generic term for six equivalent planes. As shown in FIG. 3(B), on (110) plane of the six equivalent planes, two equivalent slip directions exist in the case where a plus direction and a minus direction are not distinguished. Accordingly, a number of slip systems is 6 planes×2 directions=12.

However, according to a film forming condition, there is a case where (110) plane is preferentially oriented substantially orthogonal to the principal surface of the film. Hereinafter, such an orientation is called "preferential orientation of (110) plane". In the case of the preferential orientation of (110) plane, large cracks occur when a film thickness exceeds about 9 μm, and therefore, an upper limit of the film thickness becomes low.

Figure 4:
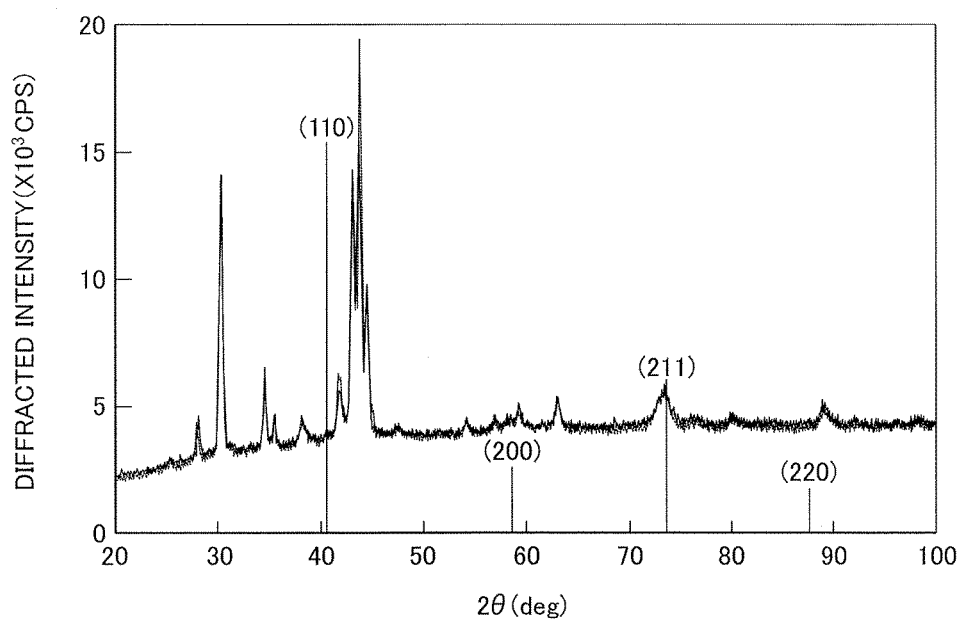
FIG. 4 shows an XRD (X-ray diffraction) profile of a molybdenum film formed on condition that the preferential orientation of (110) plane is not applied.
Figure 5:
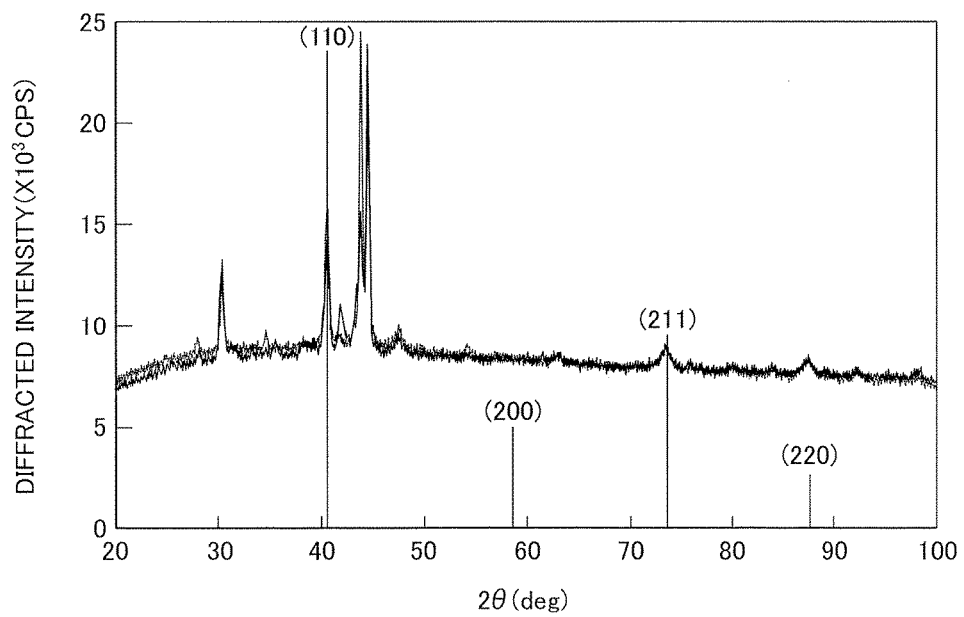
FIG. 5 shows an XRD profile of a molybdenum film formed on condition that the preferential orientation of (110) plane is applied.

FIG. 4 shows an XRD (X-ray diffraction) profile of a molybdenum film formed on condition that the preferential orientation of (110) plane is not applied. FIG. 5 shows an XRD profile of a molybdenum film formed on condition that the preferential orientation of (110) plane is applied. In FIGS. 4 and 5, the horizontal axis represents a diffraction angle 2θ (deg) of an X-ray, and the vertical axis represents diffracted intensity (×10³ CPS). These profiles were obtained by applying the X-ray onto three-layered films composed of a nickel-tin (Ni—Sn) alloy film having a thickness of 0.9 μm/a cobalt (Co) film having a thickness of 1.4 μm/a molybdenum (Mo) film having a thickness of 7 μm. A solid line and a broken line represent results in the cases where the three-layered films are formed on wafers of a P-type semiconductor and an N-type semiconductor, respectively. Difference due to the materials of the wafers is hardly observed.

An endurance test was performed in the air at a temperature of 280° C. for 1000 hours for a thermoelectric power module in which a molybdenum film not having the preferential orientation of (110) plane is formed as the first diffusion prevention layer 61. As a result thereof, no oxidation of the thermoelectric element is observed when a thickness of the molybdenum film is 2.7 μm at minimum. On the other hand, when the thickness of the molybdenum film is less than 2.7 μm, oxidation is observed in a portion of the thermoelectric element.

Figure 6:
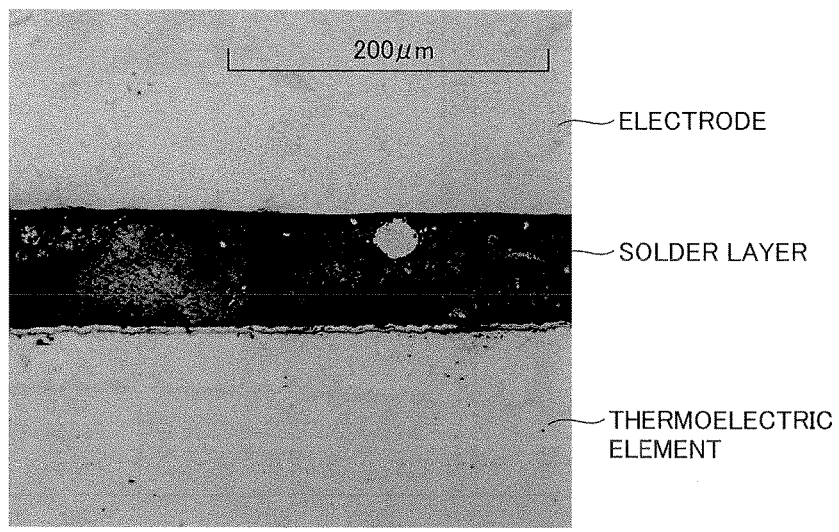
FIG. 6 shows a photomicrograph of a cross section of a thermoelectric power module after an endurance test, in which a molybdenum film having a thickness of 2.7 µm and not having the preferential orientation of (110) plane is formed as the first diffusion prevention layer.

FIG. 6 shows a photomicrograph of a cross section of a thermoelectric power module after the endurance test, in which a molybdenum film having a thickness of 2.7 μm and not having the preferential orientation of (110) plane is formed as the first diffusion prevention layer. As shown in FIG. 6, diffusion of a material of the solder layer or the solder joint layer into the thermoelectric element and oxidation of the thermoelectric element are not observed. In addition, a large amount of polishing powder adhered when polishing a surface of the thermoelectric power module is imaged around copper balls (which will be explained later) of the solder layer in FIG. 6 and so on. However, the polishing powder is not a part of constitution of the solder layer.

Figure 25:
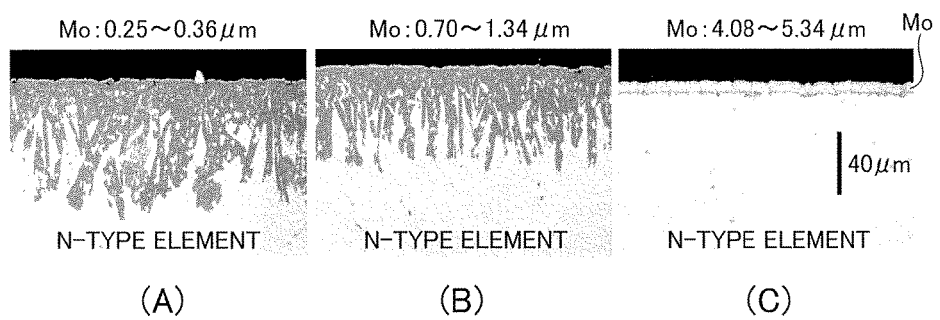
FIG. 25 shows difference of effects of preventing diffusion and oxidation according to a thickness of a molybdenum film formed on a surface of an N-type element.
Figure 26:
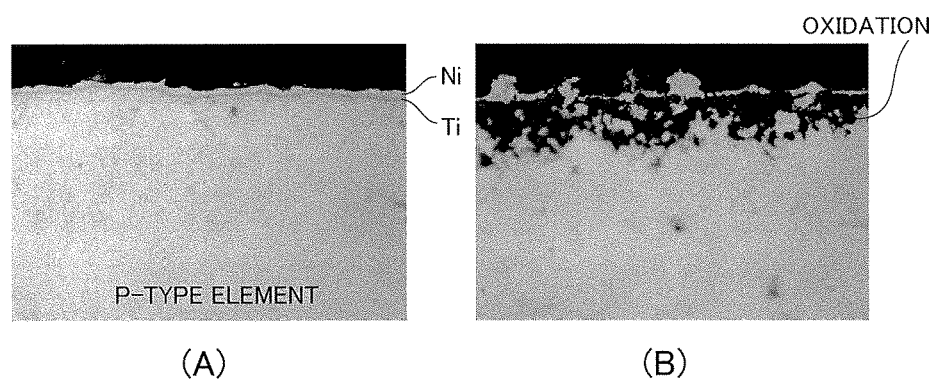
FIG. 26 shows a change in an endurance test in the case where sputtered films of titanium and nickel are formed in sequence on a surface of a P-type element.
Figure 27:
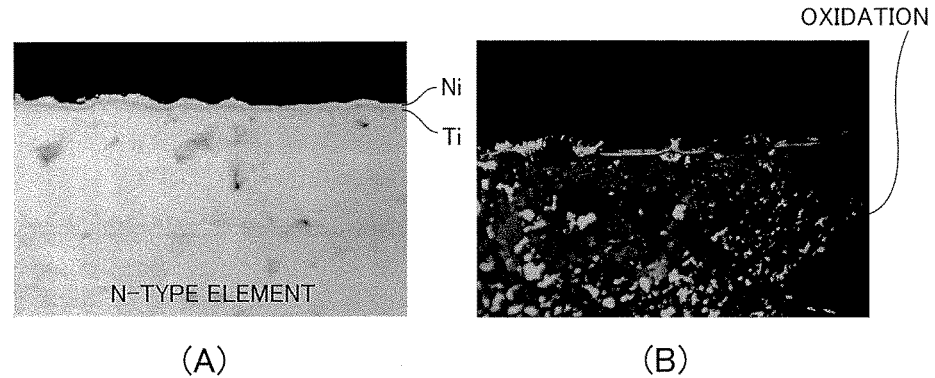
FIG. 27 shows a change in an endurance test in the case where sputtered films of titanium and nickel are formed in sequence on a surface of an N-type element.
Figure 28:
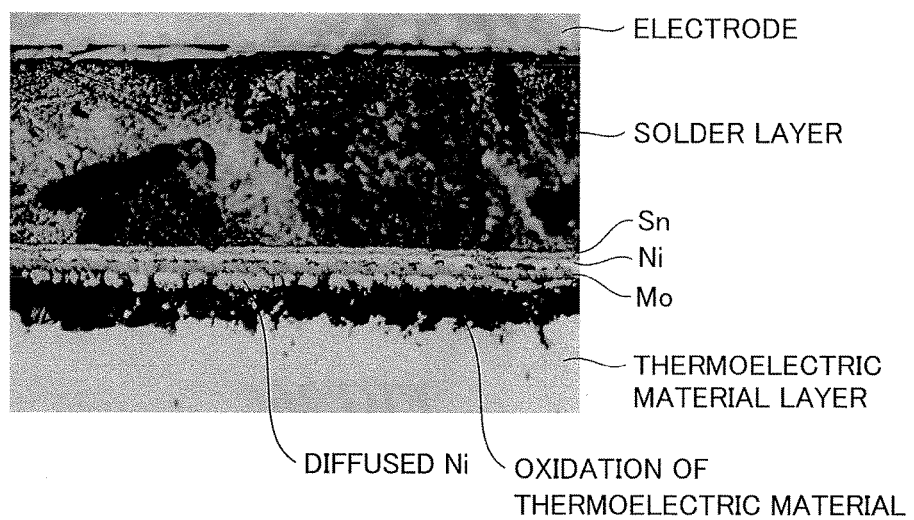
FIG. 28 shows a result of an endurance test in the case where a molybdenum film, a nickel film, and a tin film are formed in sequence on a surface of a thermoelectric material layer.

Further, even in the case where the second diffusion prevention layer is not formed, when a thickness of the molybdenum film is 4.0 μm or larger, oxidation of the thermoelectric element is suppressed. An endurance test was performed on the air at a temperature of 350° C. for 500 hours for a sample in which a molybdenum film is formed on a surface of the thermoelectric element (See FIG. 25). As a result thereof, in the case where a thickness of the molybdenum film is 4.0 μm or larger, no oxidation of the thermoelectric element is observed. On the other hand, in the case where the thickness of the molybdenum film is less than 4.0 μm, oxidation is observed in a portion of the thermoelectric element.

It is desirable that the first diffusion prevention layer 61 as shown in FIG. 2 has preferably a thickness of 13 μm or less, more preferably a thickness of 9 μm or less. In the case where a molybdenum film not having the preferential orientation of (110) is formed as the first diffusion prevention layer 61, the molybdenum film can be formed up to a film thickness of 13 μm without peeling off while no large crack occurs and no oxidation of the thermoelectric element occurs. On the other hand, when the film thickness exceeds 13 μm, there is a case where large cracks occur in the film due to a difference of linear expansion coefficients, and oxidation occurs in a portion of the thermoelectric element.

Figure 7:
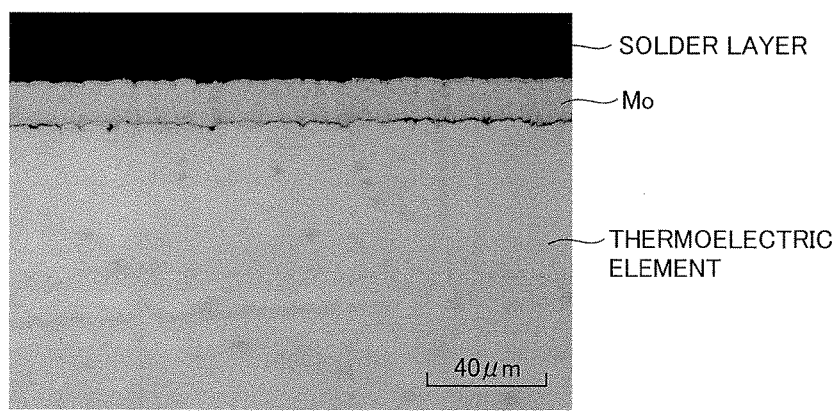
FIG. 7 shows a photomicrograph of a cross section of a thermoelectric power module after an endurance test, in which a molybdenum film having a thickness of 13 µm and not having the preferential orientation of (110) plane is formed as the first diffusion prevention layer.

An endurance test was performed in the air at a temperature of 350° C. for 500 hours for a thermoelectric power module in which a molybdenum film not having the preferential orientation of (110) plane is formed as the first diffusion prevention layer 61. FIG. 7 shows a photomicrograph of a cross section of a thermoelectric power module after the endurance test, in which a molybdenum film having a thickness of 13 μm and not having the preferential orientation of (110) plane is formed as the first diffusion prevention layer. As shown in FIG. 7, no large crack of the molybdenum film is observed, and no oxidation of the thermoelectric element is observed. In addition, also in view of industrial engineering time and cost, it is considered that a film thickness of substantially 13 μm is an upper limit.

Further, in the case where a molybdenum film having the preferential orientation of (110) plane as the first diffusion prevention layer 61, the molybdenum film can be formed up to a film thickness of 9.0 μm without peeling off while no large crack occurs and no oxidation of the thermoelectric element occurs. On the other hand, when the film thickness exceeds 9.0 μm, large cracks occur in the film due to a difference of linear expansion coefficients, and oxidation occurs in a portion of the thermoelectric element.

An endurance test was performed in oxygen at a temperature of 280° C. for 1000 hours for a thermoelectric power module in which a molybdenum film having the preferential orientation of (110) plane is formed as the first diffusion prevention layer 61. Results thereof are shown in FIGS. 8 and 9.

Figure 8:
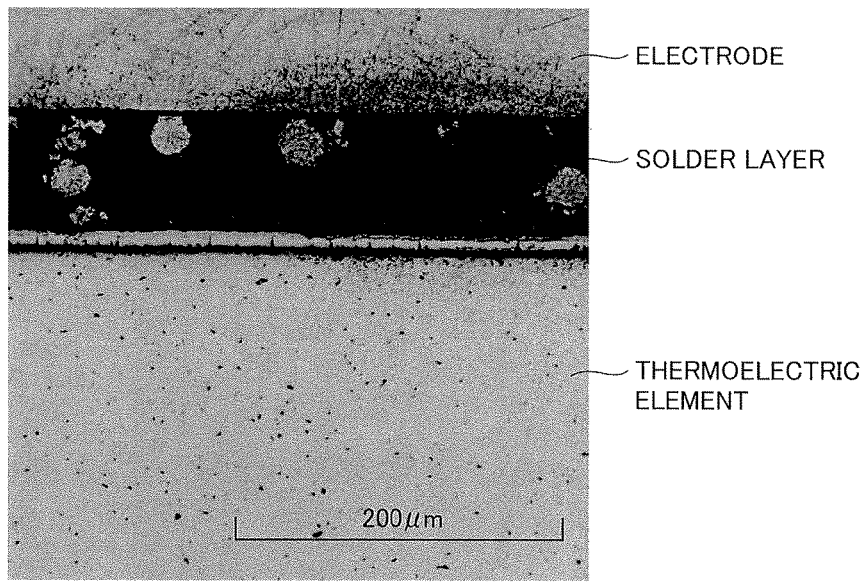
FIG. 8 shows a photomicrograph of a cross section of a thermoelectric power module after an endurance test, in which a molybdenum film having a thickness of 8.7 µm and having the preferential orientation of (110) plane is formed as the first diffusion prevention layer.

FIG. 8 shows a photomicrograph of a cross section of a thermoelectric power module after the endurance test, in which a molybdenum film having a thickness of 8.7 μm and having the preferential orientation of (110) plane is formed as the first diffusion prevention layer. As shown in FIG. 8, no large crack occurs in the molybdenum film, and no oxidation of the thermoelectric element occurs.

Figure 9:
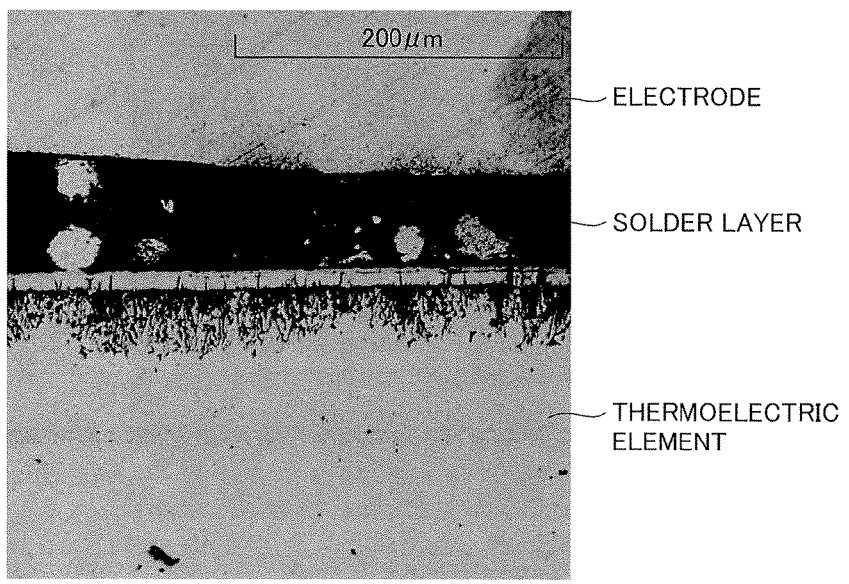
FIG. 9 shows a photomicrograph of a cross section of a thermoelectric power module after an endurance test, in which a molybdenum film having a thickness of 9.3 µm and having the preferential orientation of (110) plane is formed as the first diffusion prevention layer.

FIG. 9 shows a photomicrograph of a cross section of a thermoelectric power module after the endurance test, in which a molybdenum film having a thickness of 9.3 μm and having the preferential orientation of (110) plane is formed as the first diffusion prevention layer. As shown in FIG. 9, large cracks occur in the molybdenum film, and oxidation occurs in a portion of the thermoelectric element.

In the case where the first diffusion prevention layer 61 has constitution of columnar structure in FIG. 2, a material of the solder joint layer 70 or oxygen diffuses or passes through grain boundary (between columns), which exerts a bad influence on the thermoelectric conversion characteristics. Accordingly, by providing the second diffusion prevention layer 62, it is possible to drastically suppress the bad influence exerted on the thermoelectric conversion characteristics.

It is desirable that the second diffusion prevention layer 62 has preferably a thickness of 0.5 μm or larger, more preferably a thickness of 0.9 μm or larger. An endurance test was performed in oxygen at a temperature of 280° C. for 1000 hours for a thermoelectric power module in which a cobalt film is formed as the second diffusion prevention layer 62 in the case where a molybdenum film as the first diffusion prevention layer 61 does not have the preferential orientation of (110) plane. As a result thereof, no oxidation of the thermoelectric element is observed even when a thickness of the second diffusion prevention layer 62 is 0.5 μm at minimum.

Figure 10:
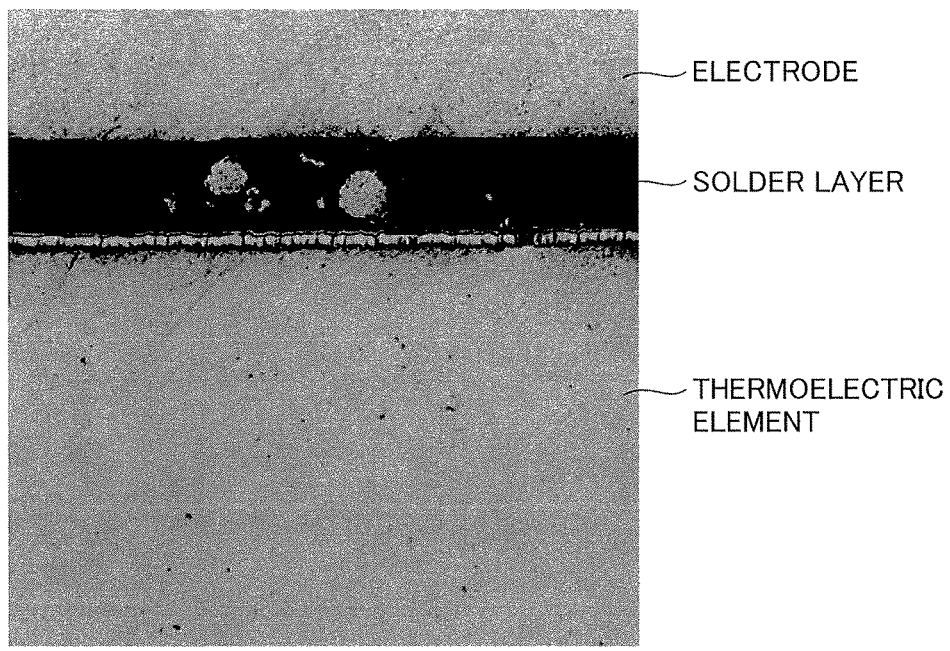
FIG. 10 shows a photomicrograph of a cross section of a thermoelectric power module after an endurance test, in which a cobalt film having a thickness of 0.5 µm is formed as the second diffusion prevention layer.

FIG. 10 shows a photomicrograph of a cross section of a thermoelectric power module after the endurance test, in which a cobalt film having a thickness of 0.5 μm is formed as the second diffusion prevention layer. As shown in FIG. 10, diffusion of a material of the solder layer or the solder joint layer into the thermoelectric element and oxidation of the thermoelectric element are not observed.

On the other hand, in the case where a thickness of the second diffusion prevention layer 62 is less than 0.5 μm, a portion, in which atoms, molecules, or clusters of components of the film are hard to be formed, is produced when the film is formed under the influence of roughness of the base film or droplets of the molybdenum film, and a portion which is not covered with the second diffusion prevention layer 62 is apt to be produced, and therefore, it is undesirable.

Further, an endurance test was performed in oxygen at a temperature of 280° C. for 1000 hours for a thermoelectric power module in which a cobalt film is formed as the second diffusion prevention layer 62 in the case where a molybdenum film as the first diffusion prevention layer 61 has the preferential orientation of (110) plane. As a result thereof, in the case where a thickness of the second diffusion prevention layer 62 is 0.9 μm or larger, no oxidation of the thermoelectric element occurs. On the other hand, in the case where a thickness of the second diffusion prevention layer 62 is less than 0.9 μm, oxidation occurs in a portion of the thermoelectric element.

It is desirable that the second diffusion prevention layer 62 has preferably a thickness of 7 μm or less, more preferably a thickness of 2.4 μm or less. In the case where the molybdenum film as the first diffusion prevention layer 61 does not have the preferential orientation of (110) plane, when a thickness of the second diffusion prevention layer 62 is 7.1 μm n or less, the film can be formed without peeling off, and no peeling off of the film and no oxidation of the thermoelectric element occur. On the other hand, when the thickness of the second diffusion prevention layer 62 exceeds 7.1 μm, there is a case where peeling off of the film occurs due to a difference of linear expansion coefficients or oxidation of the thermoelectric element occurs.

Figure 11:
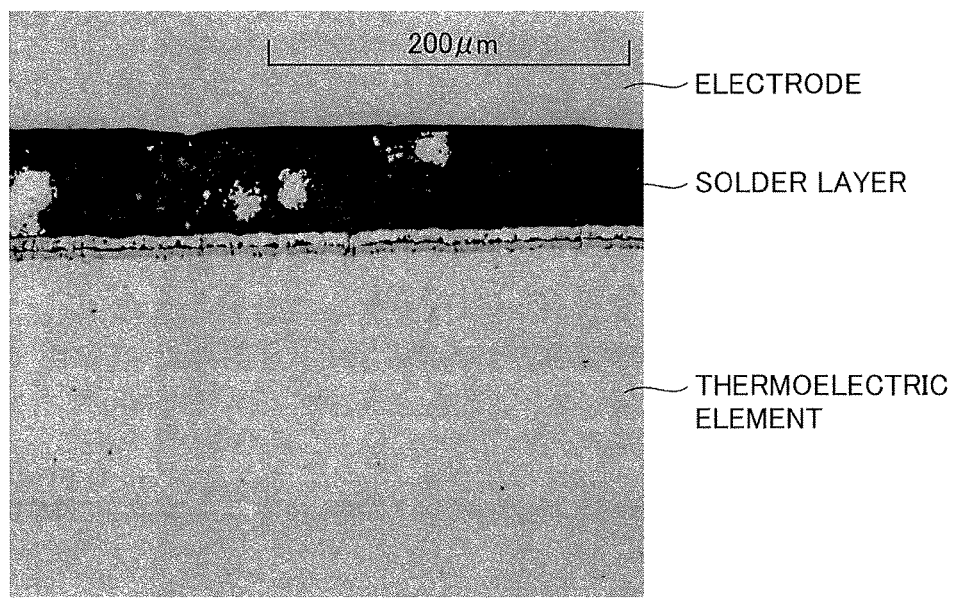
FIG. 11 shows a photomicrograph of a cross section of a thermoelectric power module after an endurance test, in which a cobalt film having a thickness of 7.1 µm is formed as the second diffusion prevention layer.

An endurance test was performed in oxygen at a temperature of 280° C. for 1000 hours for a thermoelectric power module in which a cobalt film is formed as the second diffusion prevention layer 62 in the case where a molybdenum film as the first diffusion prevention layer 61 does not have the preferential orientation of (110) plane. FIG. 11 shows a photomicrograph of a cross section of a thermoelectric power module after the endurance test, in which a cobalt film having a thickness of 7.1 μm is formed as the second diffusion prevention layer. As shown in FIG. 11, no peeling off of the film and no oxidation of the thermoelectric element occur. In addition, also in view of industrial engineering time and cost, it is considered that a film thickness of substantially 7 μm is an upper limit.

Further, in the case where a molybdenum film as the first diffusion prevention layer 61 has the preferential orientation of (110) plane, when a thickness of the second diffusion prevention layer 62 is 2.4 μm or less, no large crack occurs in the molybdenum film, and no oxidation of the thermoelectric element occurs. On the other hand, when the thickness of the second diffusion prevention layer 62 exceeds 2.4 μm, large cracks occur in the molybdenum film due to a difference of linear expansion coefficients, and oxidation occurs in a portion of the thermoelectric element.

An endurance test was performed in oxygen at a temperature of 280° C. for 1000 hours for a thermoelectric power module in which a cobalt film is formed as the second diffusion prevention layer 62 in the case where a molybdenum film as the first diffusion prevention layer 61 has the preferential orientation of (110) plane. Results thereof are shown in FIGS. 12 and 13.

Figure 12:
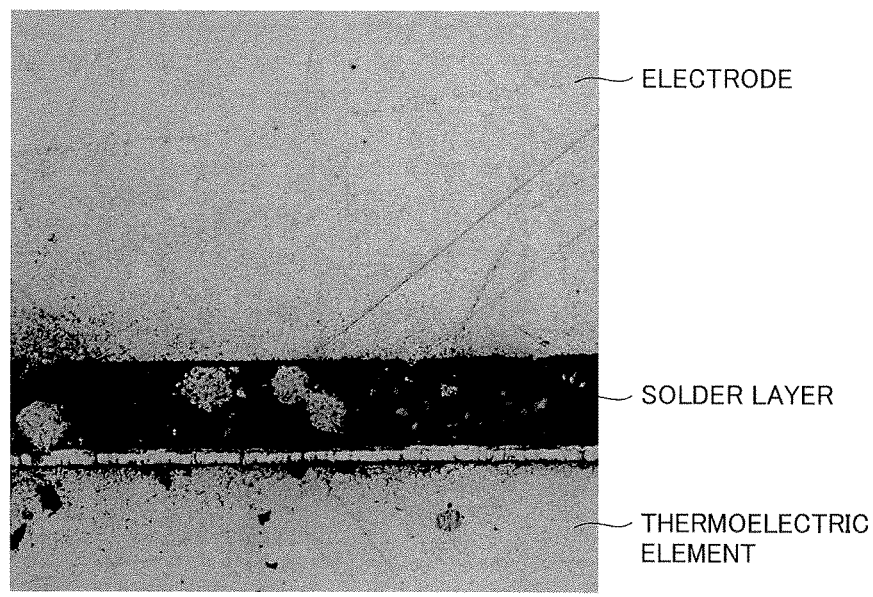
FIG. 12 shows a photomicrograph of a cross section of a thermoelectric power module after an endurance test, in which a cobalt film having a thickness of 2.4 µm is formed as the second diffusion prevention layer.
Figure 13:
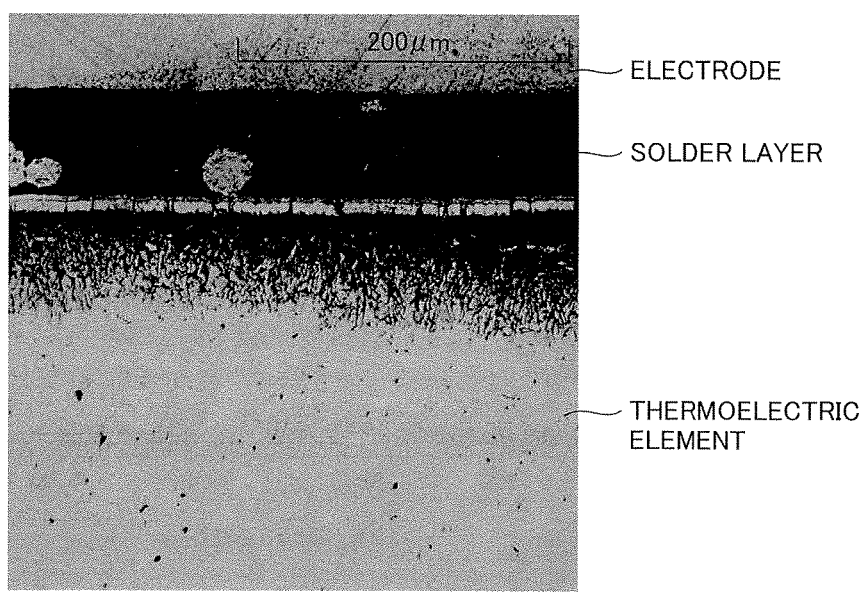
FIG. 13 shows a photomicrograph of a cross section of a thermoelectric power module after an endurance test, in which a cobalt film having a thickness of 2.9 µm is formed as the second diffusion prevention layer.

FIG. 12 shows a photomicrograph of a cross section of a thermoelectric power module after the endurance test, in which a cobalt film having a thickness of 2.4 μm is formed as the second diffusion prevention layer. As shown in FIG. 12, no large crack occurs in the molybdenum film, and no oxidation of the thermoelectric element occurs. FIG. 13 shows a photomicrograph of a cross section of a thermoelectric power module after the endurance test, in which a cobalt film having a thickness of 2.9 μm is formed as the second diffusion prevention layer. As shown in FIG. 13, large cracks occur in the molybdenum film due to a difference of linear expansion coefficients, and oxidation occurs in a portion of the thermoelectric element.

It is desirable that the solder layer 80 as shown in FIG. 2 includes solder having a composition containing lead (Pb) and tin (Sn) as principal components, and a ratio thereof is represented by $Pb_xSn_{(1-x)}$ (x≥0.85). By employing solder having such a composition, it is possible to provide a thermoelectric power module capable of bearing use at a high temperature. Further, since content of tin (Sn) is low, reaction or alloying of the solder joint layer 70 or the second diffusion prevention layer 62 and tin (Sn) is suppressed, and peeling off of each layer can be prevented. In addition, a content rate of tin (Sn) may be extremely near zero (x<1).

In the case where solder in the solder layer 80 contains lead (Pb) at 85% or more, a melting point of solder becomes 260° C. or higher, and thereby, solder does not melt at a high temperature of 260° C. and can favorably join the thermoelectric element to the electrode. Further, in the case where a content rate of lead is 90% or more, a melting point of solder becomes 275° C. or higher. In the case where a content rate of lead is 95% or more, a melting point of solder becomes 305° C. or higher. In the case where a content rate of lead is 98% or more, a melting point of solder becomes 317° C. or higher.

Figure 14:
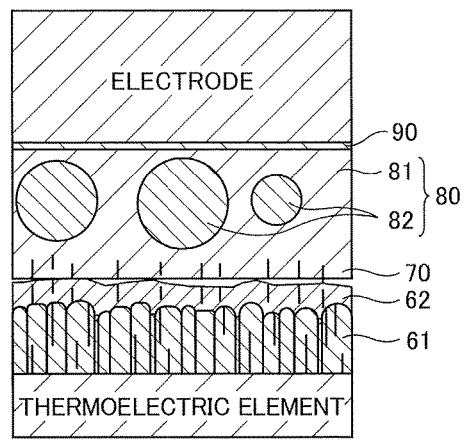
FIG. 14 is a detailed cross section diagram showing the structure surrounding the solder layer in FIG. 2.

FIG. 14 is a detailed cross section diagram showing the structure surrounding the solder layer in FIG. 2. As shown in FIG. 14, the solder layer 80 may include a solder substrate 81 and particles 82. By mixing the particles 82 into the solder layer 80 in the joint layer for joining the thermoelectric element to the electrode, the particles 82 function as clearance retaining members. Accordingly, even in the case where many thermoelectric elements and electrodes are joined to one another simultaneously, heights of the thermoelectric power module become uniform, and sufficient joining strength can be ensured. Also, in solder joining under the condition where pressure acts or in use under a high temperature environment, a thickness of the solder layer 80 is kept by the particles 82. Accordingly, solder can be prevented from jutting out, and it is possible to prevent destruction or the like due to reaction of jutting out solder and a thermoelectric material.

As the particles 82, for example, copper (Cu) balls can be employed. In the case where copper is employed as a material of the particles 82, the particles 82 do not melt and disappear at a high temperature of 260° C. to 317° C., and since the electric resistance is low, an electric current can efficiently flow between the thermoelectric element and the electrode. Further, nickel (Ni) or gold (Au) may be coated on surfaces of the copper balls.

A diameter of the copper ball is suitably 5 μm to 100 μm. In the case where the diameter of the copper ball is less than 5 μm, when pressure is applied to the thermoelectric power module under a high temperature environment of 200° C. or higher, a thickness of the solder layer 80 becomes less than 5 μm, which is too thin and causes junction defect. On the other hand, in the case where the diameter of the copper ball is larger than 100 μm, a thickness of the solder layer 80 becomes thick, which increases electric resistance of the interface and causes remarkable power loss.

Incidentally, in the case where the thermoelectric power module having the full-skeleton structure is adhered closely to the heat exchangers by using grease having thermal conductivity, thermal resistance becomes high when the pressure applied perpendicularly between the thermoelectric power module and the heat exchangers is less than 196 kN/m$^2$ (2 kgf/cm$^2$), and therefore, it is desirable that they are used while applying pressure of 196 kN/m$^2$ (2 kgf/cm$^2$) or more perpendicularly.

Since a weight ratio of the copper balls which can bear the pressure of 196 kN/m$^2$ (2 kgf/cm$^2$) is required to be 0.75 wt % or more, the lower limit of the weight ratio of the copper balls is 0.75 wt %. If the weight ratio of the copper balls is less than 0.75 wt %, the load affecting the copper balls becomes large, and the copper balls may be crushed or cracks may occur in the thermoelectric element from the copper balls as starting points.

Further, when the pressure applied perpendicularly between the thermoelectric power module and the heat exchangers is 1960 kN/m$^2$ (20 kgf/cm$^2$), in the case where the weight ratio of the copper balls is 7.5 wt %, the thermoelectric element does not change the shape, and therefore, the weight ratio of the copper balls is more desirably 7.5 wt % or more.

On the other hand, a success rate of soldered joints with regards to the weight ratio of the copper balls is measured. In the case where the weight ratio of the copper balls is 50 wt %, the success rate is about 100%, and in the case where the weight ratio of the copper balls is 75 wt %, the success rate is about 93%. Accordingly, it is desirable that the copper balls are mixed into the solder substrate 81 such that the weight ratio of the copper balls is 0.75 wt % to 75 wt %, more preferably 7.5 wt % to 50 wt %.

Next, a result of an endurance test of a thermoelectric power module will be explained. In this endurance test, measurement of electric resistance and observation of cross-sections after the endurance test were performed. In a main body of the thermoelectric power module provided for the endurance test, as shown in FIG. 1, the electrode 31 at the higher temperature part and the electrode 32 at the lower temperature part are arranged alternately, and the P-type element 10 and the N-type element 20 are arranged alternately between the upper and lower electrodes. Thereby, plural P-type elements 10 and plural N-type elements 20 are electrically connected in series via plural electrodes 31 at the higher temperature part and plural electrodes 32 at the lower temperature part. By connecting two lead wires 40 to two electrodes 32 at the lower temperature part arranged at both ends of the series circuit, respectively, electric power generated by the plural P-type elements 10 and the plural N-type elements 20 can be added and extracted.

Sides of the main body of the thermoelectric power module are surrounded by a frame made of resin (not shown). Substrates 51 and 52 having an electric insulation property are attached to an upper surface and a lower surface of the main body of the thermoelectric power module via grease having thermal conductivity, respectively. Each of the substrates 51 and 52 has a size which covers the electrodes and the flame such that the flame is not directly contact with a heat source when the thermoelectric power module is attached to the heat source.

The P-type element 10 is a fine crystal of a rhombohedral structural material containing bismuth (Bi), tellurium (Te), and antimony (Sb) as principal components. The N-type element 20 is a fine crystal of a rhombohedral structural material containing bismuth (Bi), tellurium (Te), and selenium (Se) as principal components. As to a method of forming multilayer films on the P-type element 10 and the N-type element 20, film formation was performed according to an ion plating method on the following condition. An alternating plasma output was set to 450 W, an atmosphere is argon (Ar), an electron beam was used as means for vaporizing a material, and a current of the electron beam was set to 0.3 A to 0.4 A.

The solder layer 80 (FIG. 14) is formed by mixing copper (Cu) balls of 7.5 wt % into cream solder having a composition of $Pb_{98}Sn_2$. The electrode 31 at the higher temperature side and the electrode 32 at the lower temperature side are made of pure copper, and a gold (Au) plating film/a nickel (Ni) plating film are formed as the electrode protection layer 90 (FIG. 2). A thickness of the gold (Au) plating film is 0.2 µm. The flame is made of PEEK (polyether ether ketone) resin, and the substrates 51 and 52 are made of 96% alumina.

<Measurement of Electric Resistance>

The maximum output power "P" of a thermoelectric power module is represented by the following expression (1).

$$P=V^2/4R \qquad (1)$$

Here, "V" represents an output voltage of the thermoelectric power module with no load, and "R." represents electric resistance (internal resistance) of the thermoelectric power module. In the case where a load connected to the thermoelectric power module has electric resistance equal to the internal resistance of the thermoelectric power module, the maximum power can be extracted from the thermoelectric power module. As understood from the expression (1), the maximum output power "P" decreases inversely proportionally with the electric resistance "R" of the thermoelectric power module. Accordingly, by investigating change in the electric resistance of the thermoelectric power module, it is possible to know condition of deterioration of the thermoelectric power module.

Sample A1 has multilayer films in which a molybdenum (Mo) film having a thickness of 7 µm, and a nickel-tin (Ni—Sn) alloy film having a thickness of 0.9 µm are formed in sequence on a surface of a thermoelectric element. Sample A2 has multilayer films in which a molybdenum (Mo) film having a thickness of 7 µm, a cobalt (Co) film having a thickness of 1.4 µm, and a nickel-tin (Ni—Sn) alloy film having a thickness of 0.9 µm are formed in sequence on a surface of a thermoelectric element. Sample A3 has multilayer films in which a molybdenum (Mo) film having a thickness of 7 µm, a titanium (Ti) film having a thickness of 1.4 µm, and a nickel-tin (Ni—Sn) alloy film having a thickness of 0.9 µm are formed in sequence on a surface of a thermoelectric element.

As test condition 1, a temperature at a higher temperature part of the thermoelectric power module was set to 280° C., a temperature at a lower temperature part of the thermoelectric power module was set to 30° C., and an atmosphere is the air. Then, electric resistance of one thermoelectric power module for each sample was measured while keeping the temperature at the higher temperature part and the temperature at the lower temperature part of the thermoelectric power module. Here, one thermoelectric power module includes 161 pairs of the P-type elements and the N-type elements.

Figure 15:
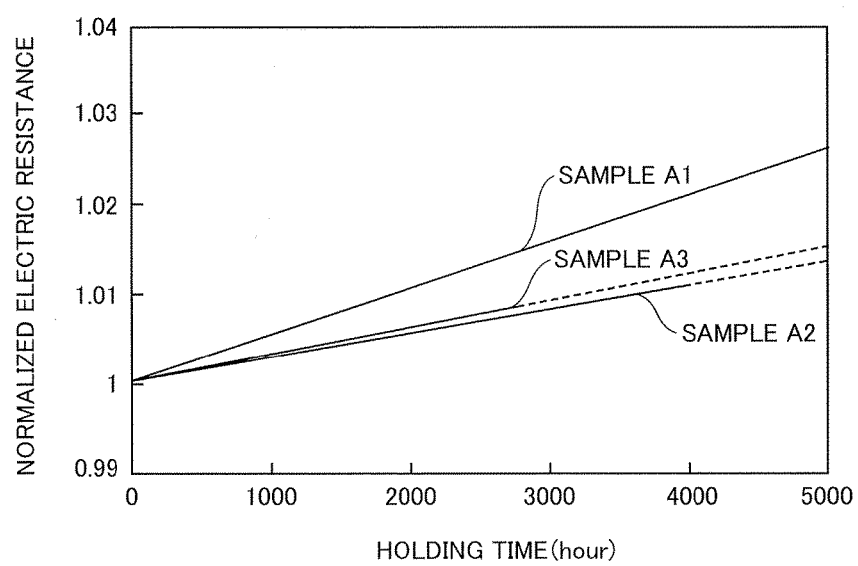
FIG. 15 is a diagram showing a result of measuring electric resistance in an endurance test performed on test condition 1.

FIG. 15 is a diagram showing a result of measuring electric resistance in an endurance test performed on test condition 1. In FIG. 15, the horizontal axis represents a holding time (hour), and the vertical axis represents normalized electric resistance in which an initial value thereof is normalized as "1". Each line in FIG. 15 is obtained by approximating measurement results at plural measurement times as a line. Although increase of the electric resistance is small in every sample, the increase of the electric resistance is smaller in samples A2 and A3, and diffusion of a material of the solder joint layer and oxidation of the thermoelectric element, which cause deterioration of the thermoelectric power module, are suppressed.

As test condition 2, a temperature of the whole thermoelectric power module was set to 280° C., and an atmosphere is oxygen. Then, electric resistance of one thermoelectric power module for each sample was measured while heating the whole thermoelectric power module.

Figure 16:
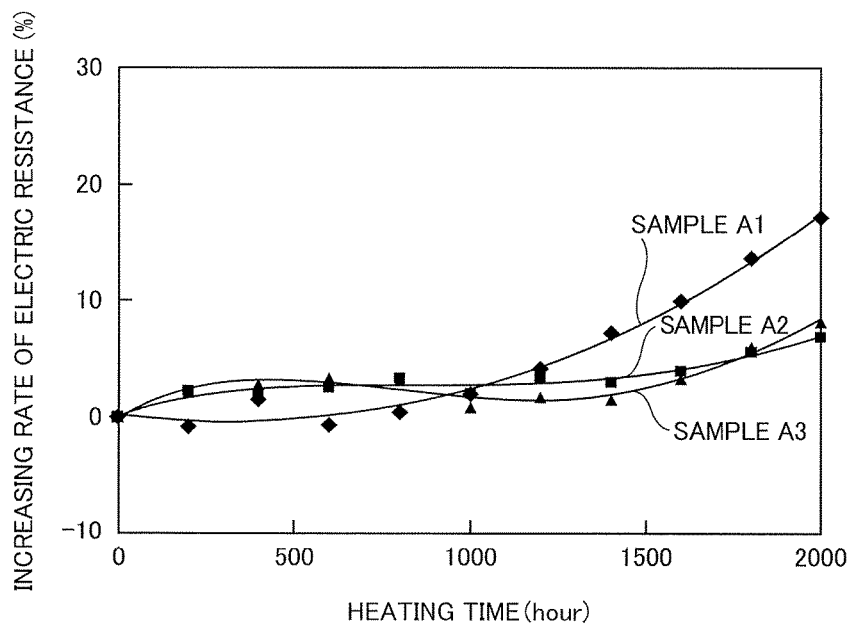
FIG. 16 is a diagram showing a result of measuring electric resistance in an endurance test performed on test condition 2.

FIG. 16 is a diagram showing a result of measuring electric resistance in an endurance test performed on test condition 2. In FIG. 16, the horizontal axis represents a heating time (hour), and the vertical axis represents an increasing rate of electric resistance (%) to an initial value. In comparison to sample A1, increasing rates of electric resistance of samples A2 and A3 are kept small after 2000 hours was elapsed.

As test condition 3, a temperature of the whole thermoelectric power module was set to 280° C., and an atmosphere is oxygen. Then, electric resistance of seven thermoelectric power modules for each sample was measured while keeping heating the whole thermoelectric power module.

Figure 17:
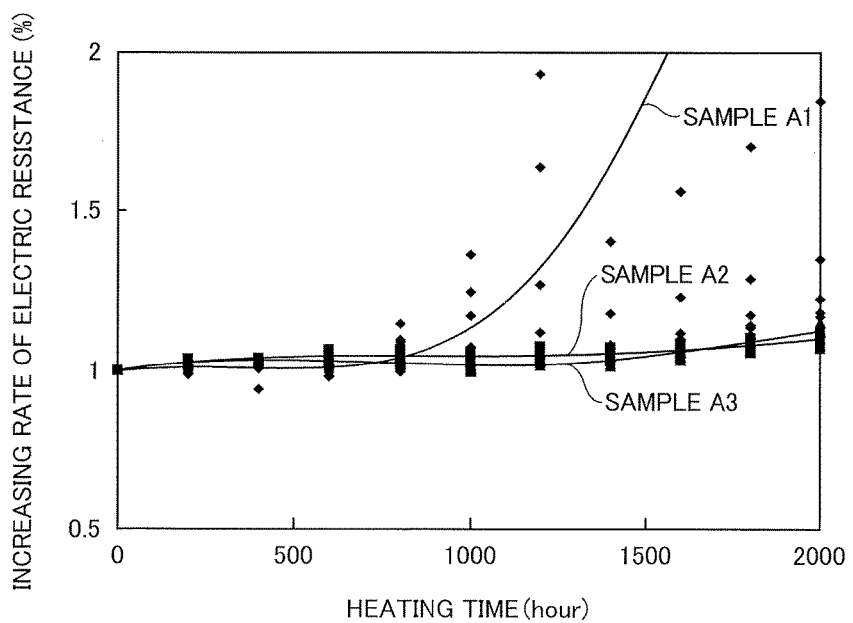
FIG. 17 is a diagram showing a result of measuring electric resistance in an endurance test performed on test condition 3.

FIG. 17 is a diagram showing a result of measuring electric resistance in an endurance test performed on test condition 3. In FIG. 17, the horizontal axis represents a heating time (hour), and the vertical axis represents an increasing rate of electric resistance to an initial value. Also on test condition 3, it is understood that increasing rates and variance of electric resistance of samples A2 and A3 are small in comparison to sample A1.

As test condition 4, a temperature of the whole thermoelectric power module was set to 280° C., and an atmosphere is oxygen. After the whole thermoelectric power module was heated for 2000 hours, electric resistance of 161 pairs of the P-type elements and the N-type elements included in each of seven thermoelectric power modules for each sample was measured at a room temperature. That is, electric resistance at 7×161=1127 points was measured for each sample.

Figure 18:
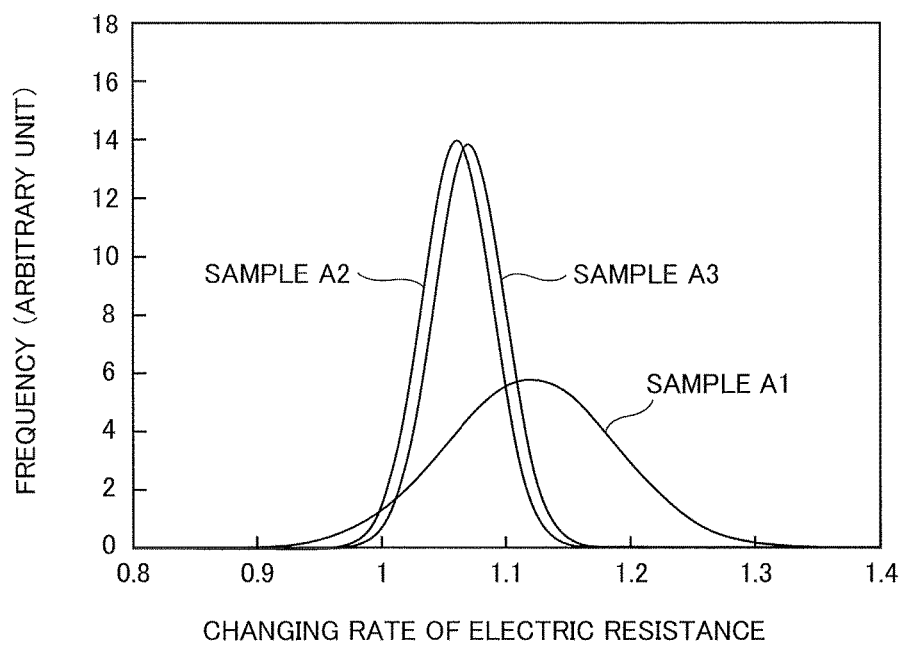
FIG. 18 is a diagram showing a normal distribution obtained from an average value and a standard deviation of a changing rate of electric resistance after an endurance test performed on test condition 4.

FIG. 18 is a diagram showing a normal distribution obtained from an average value and a standard deviation of a changing rate of electric resistance after an endurance test performed on test condition 4. In FIG. 18, the horizontal axis represents a changing rate of electric resistance to an initial value, and the vertical axis represents a frequency (arbitrary unit). Also from FIG. 18, it is verified that increasing rates and variance of electric resistance of samples A2 and A3 are small in comparison to sample A1.

<Observation of Cross-Sections after Endurance Test>

Sample B1 has multilayer films in which a molybdenum (Mo) film having a thickness of 7 μm, a nickel (Ni) film having a thickness of 1 μm, and a tin (Sn) film having a thickness of 0.2 μm are formed in sequence on a surface of a thermoelectric element. Sample B2 has multi layer films in which a molybdenum (Mo) film having a thickness of 7 μm, and a nickel-tin (Ni—Sn) alloy film having a thickness of 0.9 μm are formed in sequence on a surface of a thermoelectric element.

Sample B3-1 has multilayer films in which a molybdenum (Mo) film having a thickness of 9 μm, a cobalt (Co) film having a thickness of 1.4 μm, and a nickel-tin (Ni—Sn) alloy film having a thickness of 0.9 μm are formed in sequence on a surface of a thermoelectric element. Sample B3-2 has multilayer films in which a molybdenum (Mo) film having a thickness of 4 μm, a cobalt (Co) film having a thickness of 1.4 μm, and a nickel-tin (Ni—Sn) alloy film having a thickness of 0.9 μm are formed in sequence on a surface of a thermoelectric element. Sample B4 has multilayer films in which a molybdenum (Mo) film having a thickness of 7 μm, a titanium (Ti) film having a thickness of 1.4 μm, and a nickel-tin (Ni—Sn) alloy film having a thickness of 0.9 μm are formed in sequence on a surface of a thermoelectric element.

As a test condition, a temperature of the whole thermoelectric power module was set to 350° C., and an atmosphere is the air. Then, an endurance test was performed for heating duration of 1000 hours.

Figure 19:
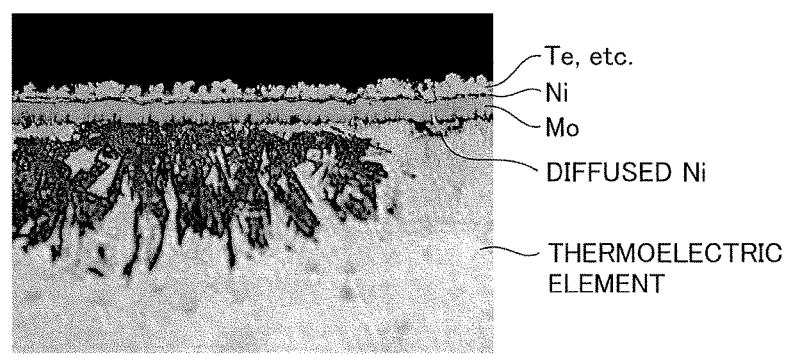
FIG. 19 shows a photomicrograph of a cross section of sample B1 after an endurance test.

FIG. 19 shows a photomicrograph of a cross section of sample B1 after the endurance test. In sample B1, nickel (Ni) and a thermoelectric material diffuse mutually, constitution of an interface between the thermoelectric element and the molybdenum (Mo) film changes, and oxidation occurs in a portion of the thermoelectric element.

Figure 20:
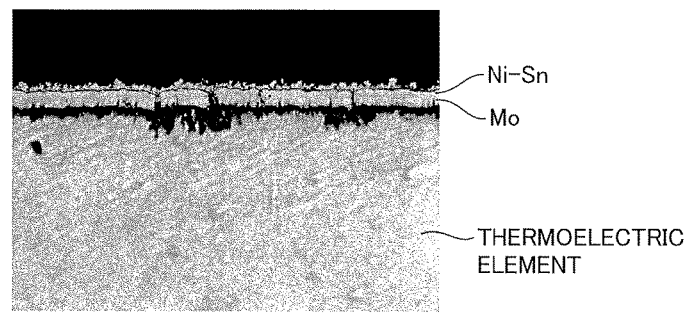
FIG. 20 shows a photomicrograph of a cross section of sample B2 after an endurance test.

FIG. 20 shows a photomicrograph of a cross section of sample B2 after the endurance test. Although the mutual diffusion is suppressed in sample B2 than that in sample B1, oxidation occurs at a thermoelectric element side of the vicinity of an interface between the thermoelectric element and the molybdenum (Mo) film.

Figure 21:
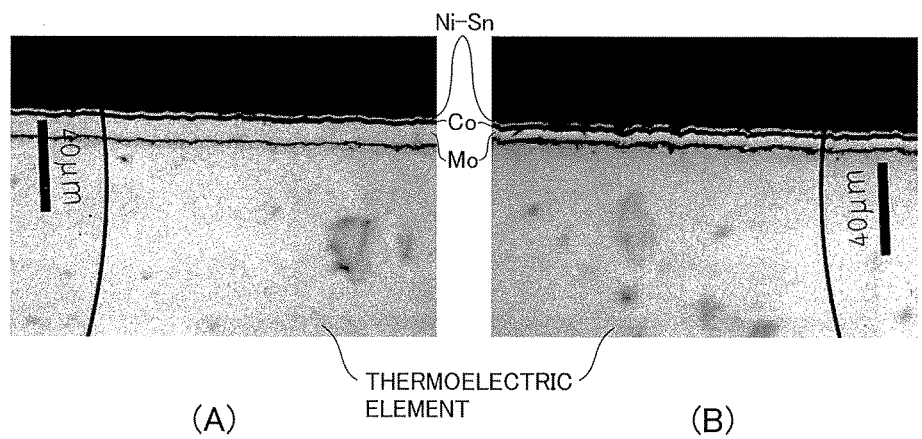
FIG. 21 shows photomicrographs of cross sections of samples B3-1 and B3-2 after an endurance test.
Figure 22:
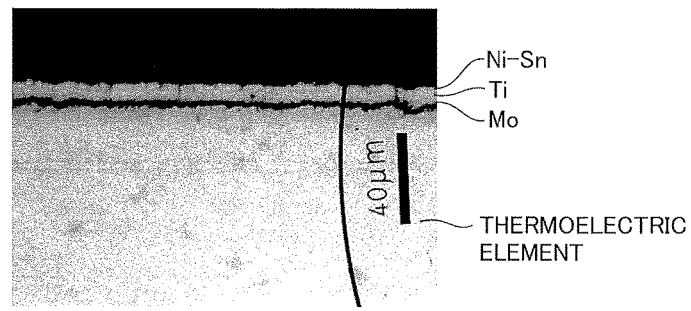
FIG. 22 shows a photomicrograph of a cross section of sample B4 after an endurance test.

FIG. 21(A) shows a photomicrograph of a cross section of sample B3-1 after the endurance test, and FIG. 21(B) shows a photomicrograph of a cross section of sample B3-2 after the endurance test. Further, FIG. 22 shows a photomicrograph of a cross section of sample B4 after the endurance test. In samples B3-1, B3-2, and B4, no remarkable change is observed after the endurance test.

Figure 23:
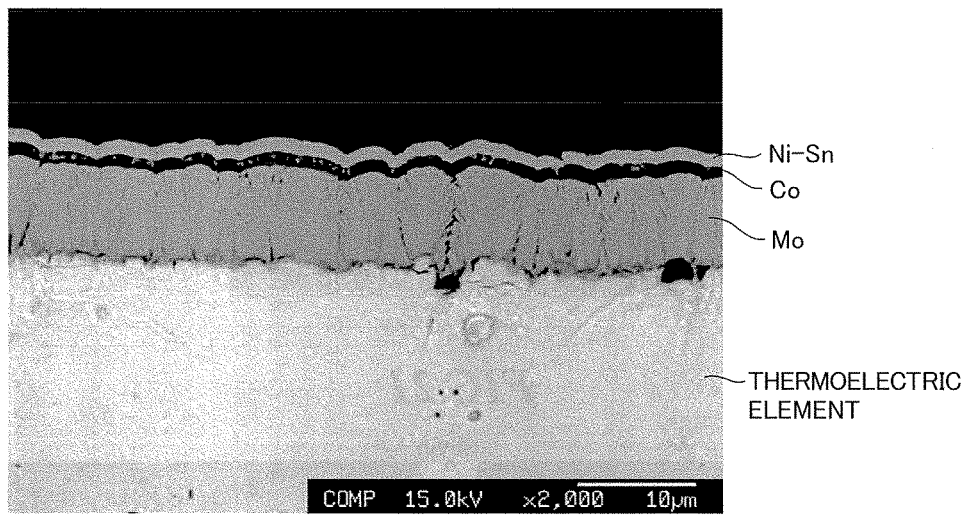
FIG. 23 shows a SEM (scanning electron microscope) image of a cross section of a sample before an endurance test.

FIG. 23 shows a SEM (scanning electron microscope) image of a cross section of a sample before the endurance test. In this sample, a molybdenum (Mo) film, a cobalt (Co) film, and a nickel-tin (Ni—Sn) alloy film are formed in sequence on a surface of a thermoelectric element. A thickness of the molybdenum (Mo) film is 9 μm. As shown in FIG. 23, the molybdenum (Mo) film as a first layer has constitution of columnar structure having a longitudinal direction substantially orthogonal to a principal surface of the film.

Figure 24:
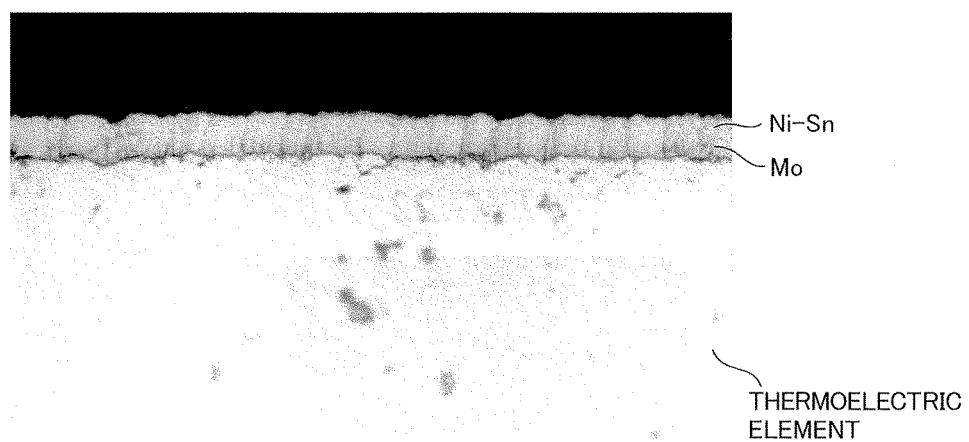
FIG. 24 shows a photomicrograph of a cross section of another sample after an endurance test.

FIG. 24 shows a photomicrograph of a cross section of another sample after the endurance test. In this sample, a molybdenum (Mo) film and a nickel-tin (Ni—Sn) alloy film are formed in sequence on a surface of a thermoelectric element. A thickness of the molybdenum (Mo) film is 10 μm. In this endurance test, heating was performed in the air at a temperature of 350° C. for 500 hours. The molybdenum (Mo) film has constitution of columnar structure, and since a great difference of linear expansion coefficients (about $1\times10^{-5}/°$ C.) is mitigated, a thick film even having a thickness of 10 μm does not peel off the thermoelectric element.

The present invention is not limited to the above-explained embodiment but many modifications are possible within the technical idea of the present invention by one of ordinary skill in the art.

INDUSTRIAL APPLICABILITY

The present invention can be applied to a thermoelectric power module using thermoelectric elements and thereby generating electricity by utilizing difference in temperature.

The invention claimed is:

1. A thermoelectric power module comprising:
   a thermoelectric element consisting essentially of a thermoelectric material containing at least two kinds of elements of bismuth (Bi), tellurium (Te), antimony (Sb), and selenium (Se) as principal components;
   a first diffusion prevention layer directly deposited on a surface of said thermoelectric element and consisting essentially of molybdenum (Mo) having columnar structure and including a crystal of a body-centered cubic lattice such that {110} plane of said crystal is orientated substantially orthogonal to the surface of said thermoelectric element while (110) plane of said crystal is not preferentially orientated, and said first diffusion prevention layer having a thickness within a range from 2.7 μm to 13 μm;
   a second diffusion prevention layer directly deposited on at least one surface of said first diffusion prevention layer opposite to said thermoelectric element side and consisting essentially of at least one of cobalt (Co), titanium (Ti), and an alloy or compound containing cobalt (Co) and titanium (Ti) as principal components;
   wherein said first diffusion prevention layer has the columnar structure that mitigates film stress generated due to a difference between linear expansion coefficients of (i) said first diffusion prevention layer and (ii) said thermoelectric element and said second diffusion prevention layer directly deposited on the at least one surface of said first diffusion prevention layer, respectively; and
   a solder joint layer directly deposited on at least one surface of said second diffusion prevention layer opposite to said first diffusion prevention layer side and consisting essentially of at least one of nickel (Ni), tin (Sn), and an alloy or compound containing nickel (Ni) and tin (Sn) as principal components.

2. The thermoelectric power module according to claim 1, wherein said second diffusion prevention layer has a thickness not less than 0.5 μm.

3. The thermoelectric power module according to claim 1, further comprising a solder layer jointed on said solder joint layer and including solder having a composition containing lead (Pb) and tin (Sn) as principal components, a ratio thereof being represented by $Pb_xSn_{(1-x)}$ (x≥0.85).

4. The thermoelectric power module according to claim 2, further comprising a solder layer jointed on said solder joint layer and including solder having a composition containing lead (Pb) and tin (Sn) as principal components, a ratio thereof being represented by $Pb_xSn_{(1-x)}$ (x≥0.85).

\* \* \* \* \*